(12) United States Patent
Pandey et al.

(10) Patent No.: US 10,985,244 B2
(45) Date of Patent: Apr. 20, 2021

(54) N-WELL RESISTOR

(71) Applicant: GLOBALFOUNDRIES U.S. INC., Santa Clara, CA (US)

(72) Inventors: Shesh Mani Pandey, Saratoga Springs, NY (US); Chung Foong Tan, Ballston Spa, NY (US); Baofu Zhu, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/451,797

(22) Filed: Jun. 25, 2019

(65) Prior Publication Data

US 2020/0411638 A1    Dec. 31, 2020

(51) Int. Cl.
*H01L 29/06* (2006.01)
*H01L 21/762* (2006.01)
*H01L 27/12* (2006.01)

(52) U.S. Cl.
CPC .... *H01L 29/0646* (2013.01); *H01L 21/76224* (2013.01); *H01L 27/1203* (2013.01)

(58) Field of Classification Search
CPC ........... H01L 27/1203; H01L 21/76224; H01L 29/0646
See application file for complete search history.

(56) References Cited

U.S. PATENT DOCUMENTS

| | | | |
|---|---|---|---|
| 7,375,000 B2 | 5/2008 | Nowak et al. | |
| 9,202,859 B1 * | 12/2015 | Heinrich-Barna | H01L 29/66166 |
| 10,121,846 B1 * | 11/2018 | Zaka | H01L 28/20 |
| 10,170,464 B2 * | 1/2019 | Balakrishnan | H01L 27/0629 |
| 2003/0201514 A1 * | 10/2003 | Radens | H01L 23/5252 257/530 |
| 2007/0040236 A1 * | 2/2007 | Nowak | H01L 29/66166 257/528 |
| 2007/0194390 A1 * | 8/2007 | Chinthakindi | H01L 27/0802 257/379 |
| 2008/0169507 A1 * | 7/2008 | Nowak | H01L 27/0802 257/350 |
| 2014/0035047 A1 * | 2/2014 | Korec | H01L 29/861 257/368 |
| 2015/0076564 A1 * | 3/2015 | Singh | H01L 21/84 257/206 |

* cited by examiner

*Primary Examiner* — Shaun M Campbell
(74) *Attorney, Agent, or Firm* — David Cain; Andrew M. Calderon; Roberts Calderon Safran & Cole, P.C.

(57) ABSTRACT

The present disclosure relates to semiconductor structures and, more particularly, to n-well resistors and methods of manufacture. The structure includes: a substrate composed of a N-well implant region and a deep N-well implant region; and a plurality of shallow trench isolation regions extending into both the N-well implant region and a deep N-well implant region.

20 Claims, 3 Drawing Sheets

N-WELL RESISTOR

FIELD OF THE INVENTION

The present disclosure relates to semiconductor structures and, more particularly, to n-well resistors and methods of manufacture.

BACKGROUND

Frequently, a circuit requires a certain resistance. To provide such resistance, resistors are used within the circuit. Resistors compatible with the CMOS technologies include diffused, polysilicon and N-well or P-well resistors. N-well resistors include a shallow N-well, which is often used because it has a much higher resistance per square as compared to source/drain diffusions. But, in semiconductor on insulator (SOI) technologies to provide well to well isolation, the shallow trench isolation (STI) is much deeper compared to the N-well depth. With this, N-well to N-well isolation is very robust; however, this restricts an N-well resistor from being used in circuit designs.

SUMMARY

In an aspect of the disclosure, a structure comprises: a substrate composed of a N-well implant region and a deep N-well implant region; and a plurality of shallow trench isolation regions extending into both the N-well implant region and the deep N-well implant region.

In an aspect of the disclosure, a structure comprises: semiconductor on insulator (SOI) technology composed of a bulk wafer, a buried oxide material and a semiconductor material on the buried oxide layer; a N-well implant region and a deep N-well implant region within the bulk wafer; and a plurality of shallow trench isolation regions extending into the semiconductor material, the buried oxide layer, the N-well implant region and the deep N-well implant region. The plurality of shallow trench isolation regions do not extend beyond the deep N-well implant region.

In an aspect of the disclosure, a method comprises: forming a plurality of shallow trench isolation regions within SOI technology; forming a N-well implant in a bulk wafer of the SOI technology; and forming a deep N-well implant below the N-well implant in the bulk wafer of the SOI technology, wherein the deep N-well implant extends beyond a depth of the plurality of shallow trench isolation regions.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to N-well resistors and methods of manufacture. More specifically, the present disclosure includes N-well resistors in silicon on insulator (SOI) technologies and methods of manufacture. Advantageously, by implementing the processes and structures described herein, it is now possible to tune or adjust resistance of the N-well by varying a density of shallow trench isolation(s) (STI) structures. In addition, the processes described herein do not required any additional masking or processing steps, compared to conventional processes.

The resistor structures of the present disclosure can be manufactured in a number of ways using a number of different tools. In general, though, the methodologies and tools are used to form structures with dimensions in the micrometer and nanometer scale. The methodologies, i.e., technologies, employed to manufacture the resistor structures of the present disclosure have been adopted from integrated circuit (IC) technology. For example, the structures are built on wafers and are realized in films of material patterned by photolithographic processes on the top of a wafer. In particular, the fabrication of the resistor structures uses three basic building blocks: (i) deposition of thin films of material on a substrate, (ii) applying a patterned mask on top of the films by photolithographic imaging, and (iii) etching the films selectively to the mask.

Figure 1:
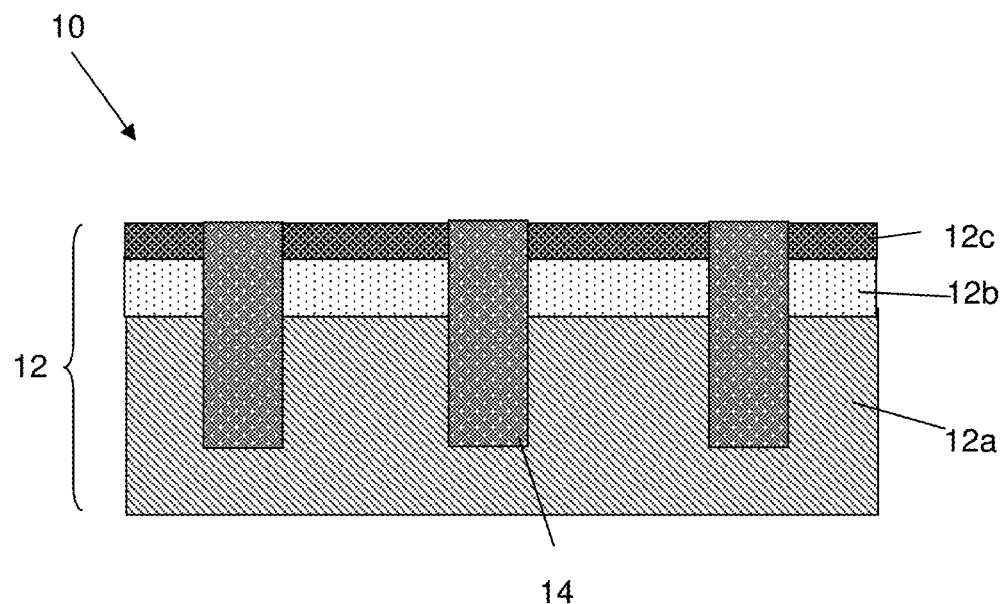
FIG. 1 shows shallow trench isolation structures in a semiconductor wafer, amongst other features, and respective fabrication processes in accordance with aspects of the present disclosure.

FIG. 1 shows shallow trench isolation structures in a semiconductor wafer, amongst other features, and respective fabrication processes. In particular, the structure 10 of FIG. 1 includes a semiconductor on insulator (SOI) substrate 12, composed of a wafer (e.g., BULK) 12a, an insulator layer 12b and a semiconductor substrate 12c formed on the insulator layer 12b. In embodiments, the insulator layer 12b is a buried oxide layer (BOX) and the semiconductor substrate 12c is Si. In further examples, the semiconductor substrate 12c can be composed of any suitable semiconductor material including, but not limited to, Si, SiGe, SiGeC, SiC, GaAs, InAs, InP, and other III/V or II/VI compound semiconductors. The substrate 12 can be formed by conventional wafer bonding or SiMOX techniques.

Shallow trench isolation (STI) regions 14 are formed within the SOI substrate 12. In embodiments, the STI regions 14 are formed by conventional lithography, etching and deposition processes, followed by a planarization process. Specifically, a resist formed over the semiconductor substrate 12c is exposed to energy (light) to form a pattern (opening). An etching process with a selective chemistry, e.g., reactive ion etching (RIE), will be used to form one or more trenches through the semiconductor substrate 12c, insulator layer 12b and wafer 12a, through the openings of the resist. Following resist removal using a conventional oxygen ashing process or other known striplants, insulator material (e.g., oxide material) can be deposited by any conventional deposition processes, e.g., chemical vapor deposition (CVD) processes. Any residual material on the surface of the semiconductor substrate 12c can be removed by conventional chemical mechanical polishing (CMP) processes.

Figure 2:
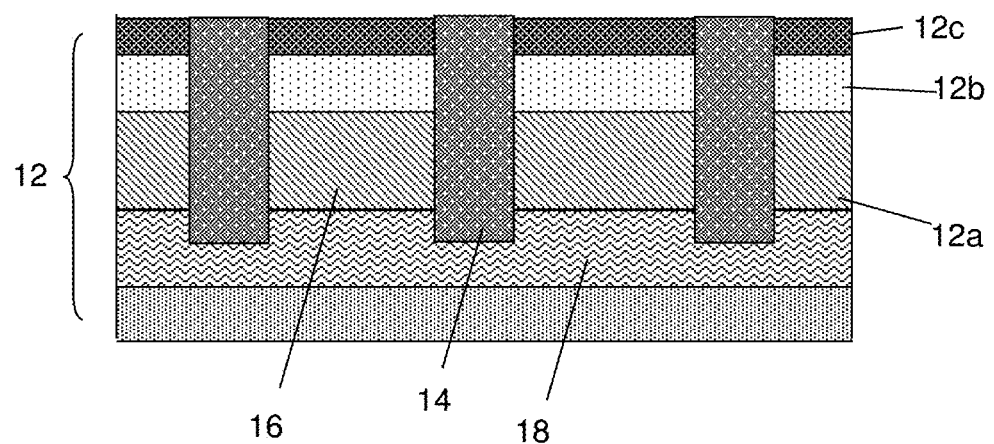
FIG. 2 shows N-well implant regions and deep N-well implant regions, amongst other features, and respective fabrication processes in accordance with aspects of the present disclosure.

FIG. 2 shows N-well implant regions and deep N-well implant regions, amongst other features, and respective fabrication processes. In embodiments, N-well implant regions 16 and the deep N-well implants 18 are formed in the wafer 12a, e.g., BULK, by an ion implanting process. In embodiments, the N-well implant regions 16 are provided between the STI regions 14; whereas, the deep N-well implant regions 18 extend below the STI regions 14. In more specific embodiments, the STI regions 14 have a depth that extends into the deep N-well implant regions 18 (and preferably not beyond the deep N-well implants 18).

The N-well implant regions 16 and the deep N-well implant regions 18 can be formed by ion implantation processes of Phosphorous or Arsenic, as examples; although other N-type dopants are contemplated herein. In embodiments, the dopant for both the N-well implant regions 16 and the deep N-well implant regions 18 are the same. As one non-limiting illustrative example, the N-well implant regions 16 can be formed with a dopant dosage of 5e12 to 5e14 with a concentration of 1e17 to 5e19. The deep N-well implant regions 18 can be formed with a higher energy than the N-well implant regions as should be understood by those of ordinary skill in the art, e.g., dopant dosage of 5e12 to 1e15 with a concentration of 1e17 to 5e20. The wafer 12a can be a P-type substrate, e.g., boron.

Figure 3:
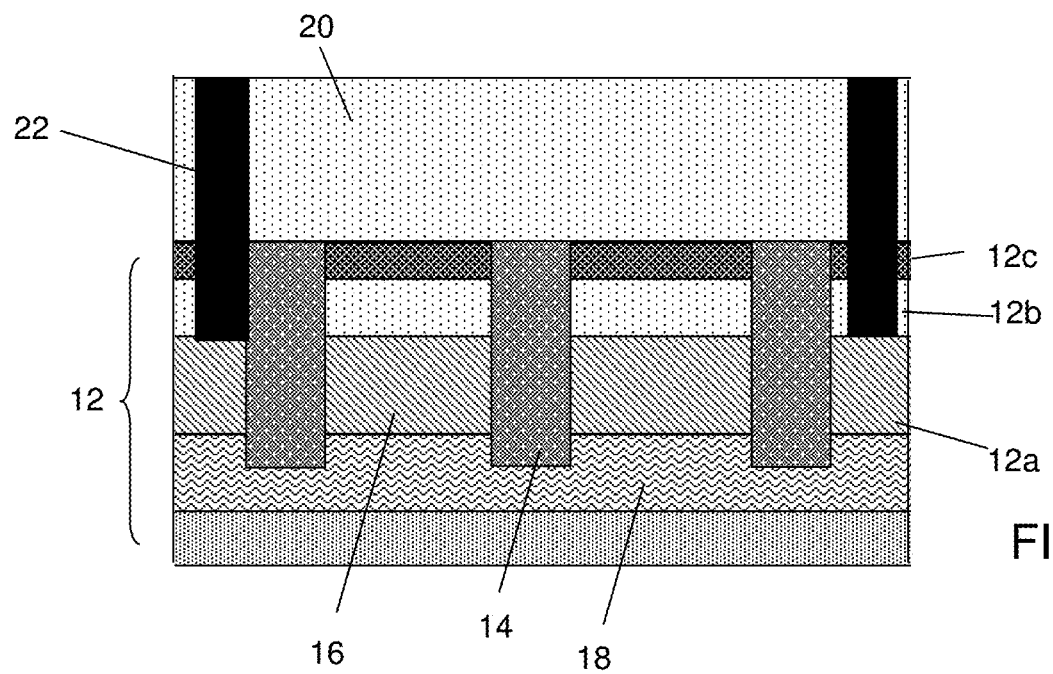
FIG. 3 shows contacts connected to the substrate, amongst other features, and respective fabrication processes in accordance with aspects of the present disclosure.

FIG. 3 shows contacts connected to the substrate, amongst other features, and respective fabrication processes. More specifically, an interlevel dielectric material 20 is deposited on the semiconductor substrate 12c. In embodiments, the interlevel dielectric material 20 can be an oxide deposited by a CVD process. Contacts 22 are formed in the interlevel dielectric material 20, extending beyond the semiconductor substrate 12c and insulator layer 12b, and contacting to the wafer 12a and more preferably the N-well implant regions 16. The contacts 22 can be tungsten or aluminum; although other conductive material is also contemplated herein. In embodiments, the contacts are formed by conventional lithography, etching and deposition processes, followed by a CMP.

Figure 4A:
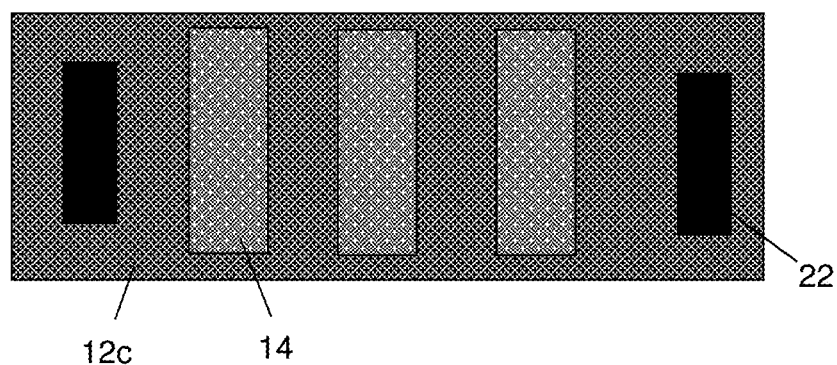
FIGS. 4A and 4B show different top cut-away views of the resistor structure in accordance with aspects of the present disclosure.
Figure 4B:
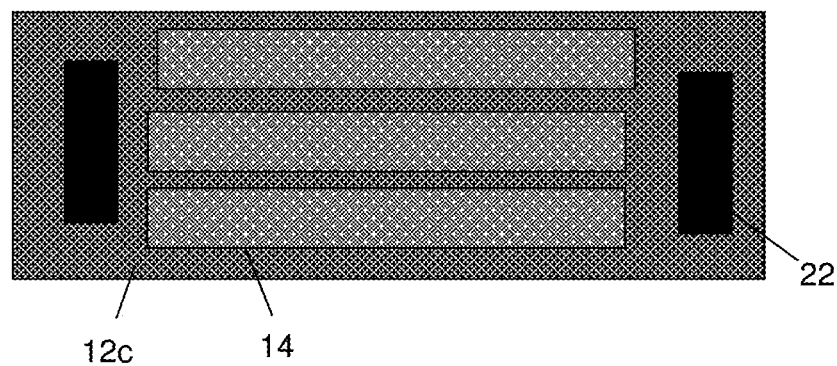

FIGS. 4A and 4B show different top cut-away views of the structure in accordance with aspects of the present disclosure. More specifically, FIGS. 4A and 4B show top cut-away views of the structures below the BOX layer, i.e., insulator layer 12b. In FIG. 4A, the shallow trench isolation (STI) regions 14 are provided in a first orientation, e.g., vertical; whereas, in FIG. 4B the shallow trench isolation (STI) regions 14 are provided in a second orientation, e.g., horizontal. It should be understood by those of ordinary skill in the art that the shallow trench isolation (STI) regions 14 can be provided in a different configurations, including more or less the shallow trench isolation (STI) regions 14. It should further be understood by those of ordinary skill in the art that the denser configuration of the shallow trench isolation (STI) regions 14 will increase the resistance of the N-well region 16. Likewise, a less dense configuration of the shallow trench isolation (STI) regions 14 will decrease the resistance of the N-well region 16.

Figure 5:
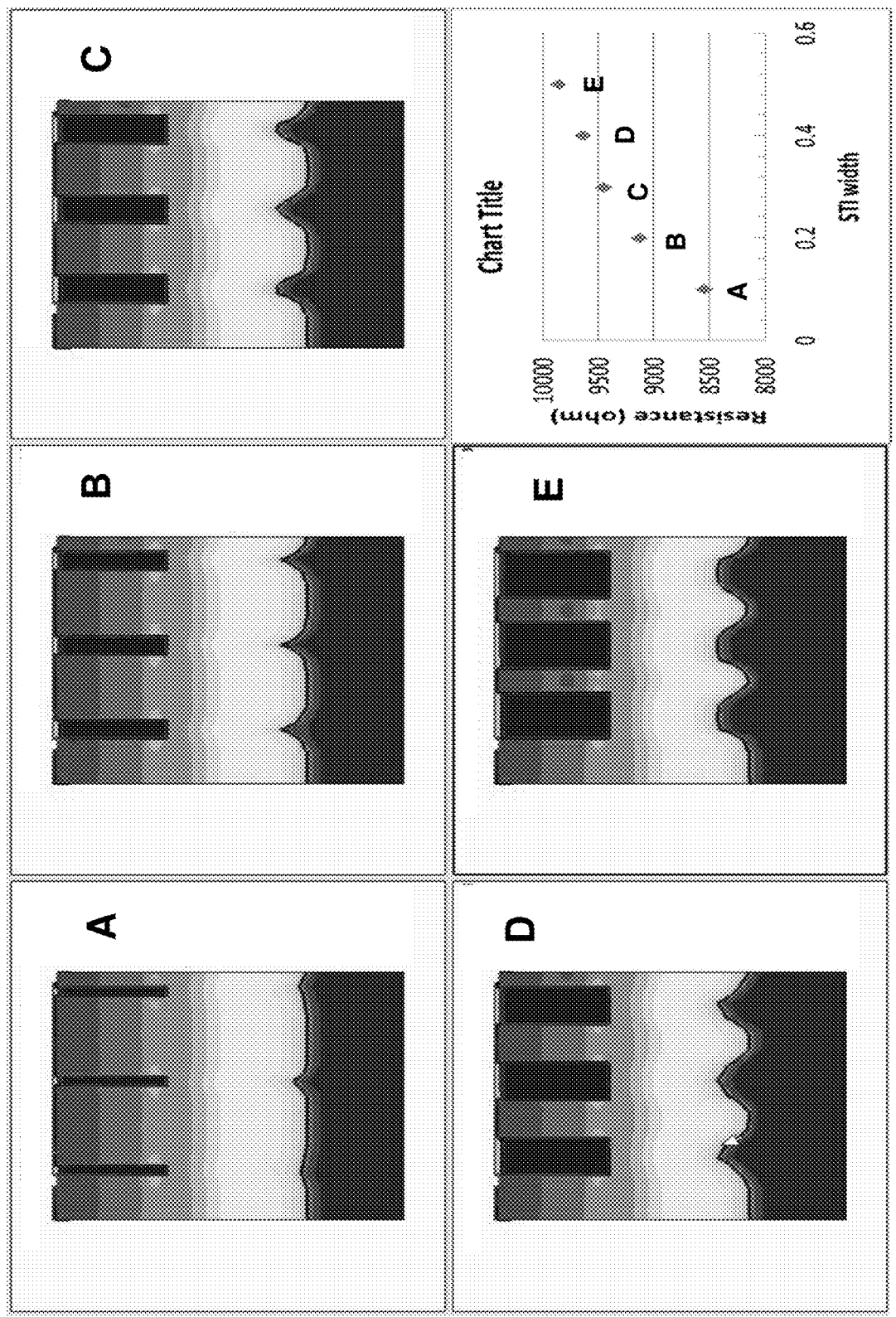
FIG. 5 shows different simulations with tuned resistances of the N-well in accordance with aspects of the present disclosure.

FIG. 5 shows different simulations with tuned resistance of the N-well in accordance with aspects of the present disclosure. More specifically, graphs "A" through "E" show different widths and, hence, different densities of shallow trench isolation (STI) regions 14 within the N-well region 16 and deep N-well implant regions 18, with the densities (width) of the shallow trench isolation (STI) regions 14 increasing from "A" to "E" (i.e., "A"<"B"<"C"<"D" and <"E"). As shown in the chart of FIG. 5, the resistance of the N-well regions 16 will increase as the width (density) of the shallow trench isolation (STI) regions 14 increases. Accordingly, it is demonstrated that the resistance of the N-well regions 16 can be tuned or adjusted for different circuitry.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a substrate composed of a N-well implant region and a deep N-well implant region, the N-well implant region and the deep N-well implant region are under a top layer of semiconductor material and a buried layer of insulator material of the substrate; and
   a plurality of shallow trench isolation regions composed of insulator material extending through the top layer of semiconductor material and the buried layer of insulator material, with the insulator material extending into and directly contacting both the N-well implant region and the deep N-well implant region; and
   contacts extending through the top layer of semiconductor layer and the layer of the buried layer of insulator material to contact the N-well implant region.

2. The structure of claim 1, wherein the plurality of shallow trench isolation regions extend beyond the N-well implant region and into the deep N-well implant region.

3. The structure of claim 2, wherein the N-well implant region and the deep N-well implant region are of a same dopant type.

4. The structure of claim 3, wherein the deep N-well implant region is directly below the N-well implant region.

5. The structure of claim 4, wherein the substrate is a p-type substrate and the top layer of semiconductor material is devoid of dopant.

6. The structure of claim 5, wherein the plurality of shallow trench isolation regions do not extend beyond the deep N-well implant region.

7. The structure of claim 6, wherein the substrate comprises the top layer of semiconductor material, a bulk wafer, and the buried layer of the insulator material between the top layer of the semiconductor material and the bulk wafer, and the plurality of shallow trench isolation regions extend through the semiconductor material and the buried layer of the insulator material to extend within the deep N-well implant region in the bulk wafer.

8. The structure of claim 1, wherein the plurality of shallow trench isolation regions are perpendicular to the contacts.

9. The structure of claim 1, wherein the plurality of shallow trench isolation regions are horizontal to the contacts.

10. The structure of claim 7, wherein the N-well implant region has a tunable resistance.

11. A structure comprising:
- a semiconductor on insulator (SOI) substrate composed of a bulk wafer, a buried oxide material and a semiconductor material on the buried oxide layer;
- a N-well implant region and a deep N-well implant region within the bulk wafer;
- a plurality of shallow trench isolation regions composed of insulator material extending into the semiconductor material, the buried oxide layer, the N-well implant region and the deep N-well implant region such that the insulator material directly contacts at least portions of the N-well implant region and the deep N-well implant region; and
- contacts extending through the semiconductor material and the buried oxide material to contact the N-well implant region.

12. The structure of claim 11, wherein the plurality of shallow trench isolation regions extend beyond the N-well implant region and into the deep N-well implant region.

13. The structure of claim 11, wherein the N-well implant region and the deep N-well implant region are of a same dopant type.

14. The structure of claim 13, wherein the bulk wafer is a p-type substrate.

15. The structure of claim 11, wherein the contacts extend to and in direct contact with the N-well implant region and the semiconductor material on the buried oxide layer is devoid of dopant.

16. The structure of claim 15, wherein the plurality of shallow trench isolation regions are perpendicular to the contacts.

17. The structure of claim 15, wherein the plurality of shallow trench isolation regions are horizontal to the contacts.

18. The structure of claim 11, wherein the N-well implant region has a tunable resistance.

19. A method comprising:
- forming a plurality of shallow trench isolation regions within a SOI substrate, the plurality of shallow trench isolation regions comprising insulator material contacting the substrate;
- forming a N-well implant in a bulk wafer of the SOI substrate;
- forming a deep N-well implant below the N-well implant in the bulk wafer of the SOI substrate; and
- forming contacts extending through semiconductor material and buried oxide material of the SOI substrate to contact the N-well implant in the bulk wafer,
- wherein the deep N-well implant extends beyond a depth of the plurality of shallow trench isolation regions and the insulator material of the plurality of shallow trench isolation regions directly contacts the N-well implant and the deep N-well implant.

20. The structure of claim 11, wherein:
- the plurality of shallow trench isolation regions comprise parallel rows of shallow trench isolation regions;
- the plurality of shallow trench isolation regions comprises oxide material which contacts and extends into the N-well implant region and the deep N-well implant region; and
- a single set of contacts extending into the bulk wafer, through the buried oxide material and the semiconductor material, the set of contacts on opposing sides of the plurality of shallow trench isolation regions.

* * * * *